United States Patent
Faibish et al.

(10) Patent No.: US 10,664,165 B1
(45) Date of Patent: May 26, 2020

(54) MANAGING INLINE DATA COMPRESSION AND DEDUPLICATION IN STORAGE SYSTEMS

(71) Applicant: EMC IP Holding Company LLC, Hopkinton, MA (US)

(72) Inventors: Sorin Faibish, Newton, MA (US); Istvan Gonczi, Berkley, MA (US); Philippe Armangau, Acton, MA (US); Vamsi Vankamamidi, Hopkinton, MA (US); Ivan Bassov, Brookline, MA (US)

(73) Assignee: EMC IP Holding Company LLC, Hopkinton, MA (US)

( * ) Notice: Subject to any disclaimer, the term of this patent is extended or adjusted under 35 U.S.C. 154(b) by 0 days.

(21) Appl. No.: 16/409,366

(22) Filed: May 10, 2019

(51) Int. Cl.
*G06F 3/06* (2006.01)
*H03M 7/30* (2006.01)

(52) U.S. Cl.
CPC .......... *G06F 3/0608* (2013.01); *G06F 3/0641* (2013.01); *G06F 3/0689* (2013.01); *H03M 7/3059* (2013.01); *H03M 7/60* (2013.01)

(58) Field of Classification Search
None
See application file for complete search history.

(56) References Cited

U.S. PATENT DOCUMENTS

| | | | |
|---|---|---|---|
| 9,367,557 B1* | 6/2016 | Lin | G06F 16/1744 |
| 10,452,616 B1* | 10/2019 | Bassov | G06F 3/0608 |
| 10,509,676 B1* | 12/2019 | Bassov | G06F 9/5016 |
| 2014/0244604 A1* | 8/2014 | Oltean | H03M 7/3091 |
| | | | 707/693 |
| 2019/0146786 A1* | 5/2019 | Rahman | G06F 8/77 |
| | | | 717/120 |

* cited by examiner

*Primary Examiner* — Howard Williams
(74) *Attorney, Agent, or Firm* — Krishnendu Gupta; Dorothy Wu Chiang

(57) ABSTRACT

A method is used in managing inline data compression and deduplication in storage systems. A block of data from data stored in a cache of a storage system is identified based on entropy. Entropy of the block of data is compared with a first threshold value. Based on the comparison, the block of data is either deduplicated or compressed without deduplication.

20 Claims, 11 Drawing Sheets

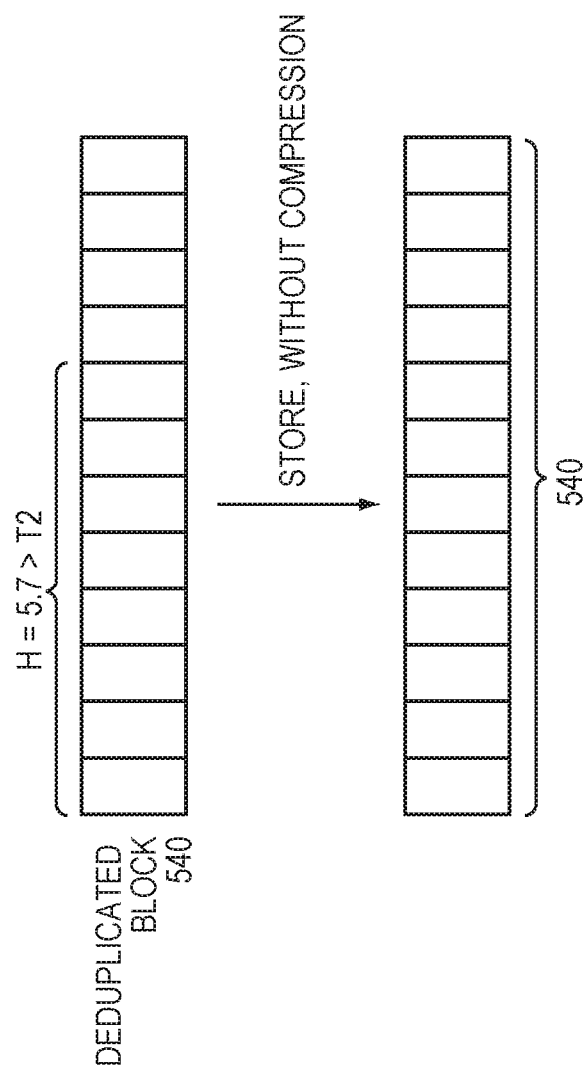

MANAGING INLINE DATA COMPRESSION AND DEDUPLICATION IN STORAGE SYSTEMS

BACKGROUND

Technical Field

This application relates to managing inline data compression and deduplication in storage systems.

Description of Related Art

Computer systems may include different resources used by one or more host processors. Resources and host processors in a computer system may be interconnected by one or more communication connections. These resources may include, for example, data storage devices. These data storage systems may be coupled to one or more servers or host processors and provide storage services to each host processor. Multiple data storage systems from one or more different vendors may be connected and may provide common data storage for one or more host processors in a computer system.

A host processor may perform a variety of data processing tasks and operations using the data storage system. For example, a host processor may perform basic system I/O operations in connection with data requests, such as data read and write operations.

Host processor systems may store and retrieve data using a storage device containing a plurality of host interface units, disk drives, and disk interface units. The host systems access the storage device through a plurality of channels provided therewith. Host systems provide data and access control information through the channels to the storage device and the storage device provides data to the host systems also through the channels. The host systems do not address the disk drives of the storage device directly, but rather, access what appears to the host systems as a plurality of logical disk units. The logical disk units may or may not correspond to the actual disk drives. Allowing multiple host systems to access the single storage device unit allows the host systems to share data in the device. In order to facilitate sharing of the data on the device, additional software on the data storage systems may also be used.

Such a data storage system typically includes processing circuitry and a set of disk drives (disk drives are also referred to herein as simply "disks" or "drives"). In general, the processing circuitry performs load and store operations on the set of disk drives on behalf of the host devices. In certain data storage systems, the disk drives of the data storage system are distributed among one or more separate disk drive enclosures (disk drive enclosures are also referred to herein as "disk arrays" or "storage arrays") and processing circuitry serves as a front-end to the disk drive enclosures. The processing circuitry presents the disk drive enclosures to the host device as a single, logical storage location and allows the host device to access the disk drives such that the individual disk drives and disk drive enclosures are transparent to the host device.

Disk arrays are typically used to provide storage space for one or more computer file systems, databases, applications, and the like. For this and other reasons, it is common for disk arrays to be structured into logical partitions of storage space, called logical units (also referred to herein as LUs or LUNs). For example, at LUN creation time, storage system may allocate storage space of various storage devices in a disk array to be presented as a logical volume for use by an external host device. This allows a disk array to appear as a collection of separate file systems, network drives, and/or volumes. Disk arrays may also include groups of physical disks that are logically bound together to represent contiguous data storage space for applications.

Some data storage systems employ software compression and decompression to improve storage efficiency. For example, software compression involves loading compression instructions into memory and executing the instructions on stored data using one or more processing cores. A result of such software compression is that compressed data requires less storage space than the original, uncompressed data. Conversely, software decompression involves loading decompression instructions into the memory and executing the instructions on the compressed data using one or more of the processing cores, to restore the compressed data to its original, uncompressed form.

Other data storage systems perform compression and decompression in hardware. For example, a data storage system may include specialized hardware for compressing and decompressing data. The specialized hardware may be provided on the storage processor itself, e.g., as a chip, chipset, or sub-assembly, or on a separate circuit board assembly. Unlike software compression, which operates by running executable software instructions on a computer, hardware compression employs one or more ASICs (Application Specific Integrated Circuits), FPGAs (Field Programmable Gate Arrays), RISC (Reduced Instruction Set Computing) processors, and/or other specialized devices in which operations may be hard-coded and performed at high speed.

Additionally, data deduplication (also referred to simply as "deduplication") is a space-saving technology intended to eliminate redundant (duplicate) data (such as, files) on a data storage system. By saving only one instance of a file, disk space can be significantly reduced. For example, if a file of size 10 megabytes (MB) is stored in ten folders of each employee in an organization that has ten employees. Thus, 100 megabytes (MB) of the disk space is consumed to maintain the same file of size 10 megabytes (MB). Deduplication ensures that only one complete copy is saved to a disk. Subsequent copies of the file are only saved as references that point to the saved copy, such that end-users still see their own files in their respective folders. Similarly, a storage system may retain 200 e-mails, each with an attachment of size 1 megabyte (MB). With deduplication, the disk space needed to store each attachment of size 1 megabyte (MB) is reduced to just 1 megabyte (MB) from 200 megabyte (MB) because deduplication only stores one copy of the attachment.

SUMMARY OF THE INVENTION

One aspect of the current technique is a method for use in managing inline data compression and deduplication in storage systems. The method includes identifying, based on entropy, a block of data from data stored in a cache of a storage system. The method also includes comparing entropy of the block of data with a first threshold value. The method further includes based on the comparison, either deduplicating the block of data or compressing the block of data without deduplication.

Between 4 KB and 128 KB of data may be identified for inclusion in the block, and the chunks of data may be stored in the cache within a predetermined window of time. The method may include determining entropy of chunks of data stored in the cache, as well as including, in the block of data, chunks of data with entropy falling below a second threshold value. Chunks may include 4 KB or 8 KB of data. The block of data may be deduplicated in increments of 512 B.

Another aspect of the current technique is a system, with a processor, for use in managing inline data compression and deduplication in storage systems. The processor is configured to identify, based on entropy, a block of data from data stored in a cache of a storage system. The processor is also configured to compare entropy of the block of data with a first threshold value. The processor is configured to, based on the comparison, either deduplicate the block of data or compress the block of data without deduplication. The processor may be configured to perform any other processes in conformance with the aspect of the current technique described above.

BRIEF DESCRIPTION OF THE DRAWINGS

Features and advantages of the present technique will become more apparent from the following detailed description of exemplary embodiments thereof taken in conjunction with the accompanying drawings in which:

FIGS. 5-9 are diagrams illustrating exemplary implementations of the techniques described herein.

DETAILED DESCRIPTION OF EMBODIMENT(S)

Figure 1:
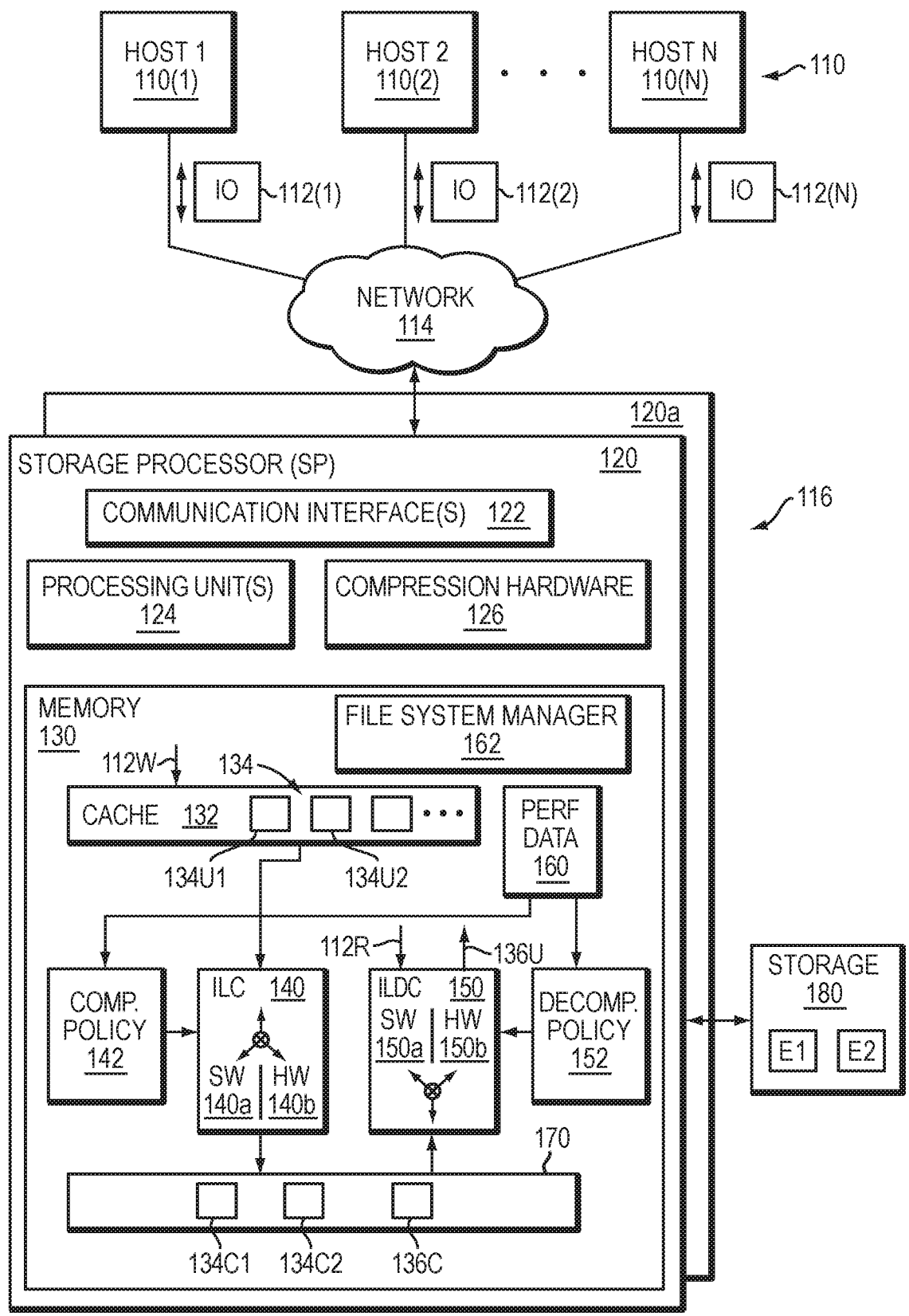
FIGS. 1 and 2 depict exemplary embodiments computer systems that may utilize the techniques described herein.

Described below is a technique for use in managing inline data compression and deduplication in a data storage system, which technique may be used to provide, among other things, identifying, based on entropy, a block of data from data stored in a cache; comparing entropy of the block of data with a first threshold value; and based on the comparison, either deduplicating the block of data or compressing the block of data without deduplication.

Data compression is an efficiency feature that allows users to store information using less storage capacity than storage capacity used without compression. With data compression, users can significantly increase storage utilization for data such as file and block data. Data compression may be characterized as the process of encoding source information using an encoding scheme into a compressed form having fewer bits than the original or source information. Different encoding schemes may be used in connection with data compression.

Inline compression (also referred to herein as "ILC") provides the ability to reduce the amount of storage required to store user data on a storage device of a storage system by compressing portions of the data at the time the data is first written to the storage device. Further, storage system resources such as CPU resources, that may otherwise remain unused, are utilized to perform inline data compression on a write data path indicating that data is compressed prior to writing the data on a storage device. Generally, ILC may be enabled by default on a storage system. However a user may be provided the ability to make a decision regarding which storage objects should be subject to compression. Further, ILC is intended to lower the cost of storage consumed (i.e., $/GB), but it is also a goal for ILC to improve the cost based on number of IO operations performed in a storage system (IOPs performed in a specific time) through better utilization.

Data deduplication is a process by which a data storage system can detect multiple identical copies of data and only keeps a single copy of that data, thus eliminating the redundant data by removing other copies of that data and thus improving storage utilization. In at least some systems, data deduplication requires iterating over data in one or more storage extents, finding the portions that contain identical information by processing digest information associated with each portion and mapping the identical portions to a single copy of the data. In such systems, an index table of unique digests is created to find commonality among the data set.

Generally, during iteration of data of a deduplication domain, a digest for each portion of data is computed and compared with digests stored in an index table. If a matching digest for a portion of data is found in an index table, contents of portions of data are compared to verify that the portions are duplicates of each other, and a portion of data is deduplicated to an identical portion associated with the matching digest found in the index table by updating address mapping information of the deduplicated portion to point to the identical portion of data found using the index table. Further, if no matching digest for a portion of data is found in an index table, the digest for the portion is added to the index table. Thus, deduplication maps portions of data that contain identical information to a single copy of the data thereby consolidating I/O operations directed to the identical portion of data to the single copy of the data.

Further, in-line data deduplication requires that portions of data in a storage extent be identified and processed for deduplication before or as the portions of data are being written to storage devices. A set of storage extents that may be deduplicated together form a deduplication domain. During the process of deduplication, generally, an index table of unique digests is created from data contents of the portions of data that are iterated through. Typically, comparing digests of portions of data is faster than comparing contents of the portions themselves because comparing the contents includes reading contents from a storage device. As a result, comparing digests of portions of data provides a fast and efficient way of determining identical portions of data if the digests of the portions match with each other.

Generally, when a portion of data is evaluated for deduplication in a storage system, a determination is made as to whether a digest identical to the digest of the portion of data exists in an index table. If such digest does not exist in the index table, it may indicate that the portion of data is unique and is not identical to any other portion in the storage system. However, if such a digest does exist in the index table, contents of a portion of data associated with the matching digest are read from a storage device and compared with contents of the portion. If the contents of the portions of data match, the portion of data is deduplicated to the portion with the matching digest. However, if contents of the portions of data do not match with each other, the portions are found to be unique and not identical to each other.

While data compression and deduplication are two foundational techniques for reducing data in storage systems, in various circumstances, the techniques may be ineffective, costly, or both. For example, data may exhibit little redundancy. Because compression leverages redundancy to reduce the data, applying compression in such situations may save only a minimal amount of storage, such as 0.5%. As for deduplication, the technique's effectiveness depends upon the particular sequences of data that the storage system has previously encountered and stored. Thus, deduplication may not always yield meaningful reductions in data, especially since conventional techniques do not assess the likelihood that the sequences present in incoming data may have been previously stored. Additionally, the storage system may shift incoming data; even if the storage system may have encountered the same data repeatedly, as when messages in an e-mail thread recirculate copies of the same file, data shifts among the copies may cause the storage system to fail to recognize the data. Under such circumstances, applying compression and/or deduplication may expend significant processing resources without a corresponding benefit in data reduction. Any allocation of processing cycles to data reduction, in lieu of servicing I/O requests, diminishes the performance of the storage system. Consequently, conventional approaches to compression and deduplication may degrade storage system performance without producing commensurate savings in storage.

In contrast, various embodiments of the current technique leverage the entropy of data stored in the cache to assess how these techniques may be applied in more cost-effective manners. In general, entropy may serve as a measure of randomness in data. If data has high entropy, the data may not exhibit sufficient redundancy for compression to be cost effective. For example, attempting to compress data with high entropy may reduce the data by only 1.0%, whereas attempting to compress data with low entropy may reduce the data by 15%. Thus, many embodiments of the current technique use entropy to gauge the likely cost effectiveness of compression. Depending on the entropy of data, various embodiments of the current technique may decide to apply or forgo data compression.

Additionally, if chunks of data have similar entropy, their data exhibits comparable levels of randomness. Compressing the data in the chunks together may exploit the redundancy across the chunks to achieve greater data reduction, compared to the storage savings that would be obtained by compressing the chunks individually. Thus, some embodiments of the current technique group together chunks of data with similar entropy to be compressed together.

Figure 4:
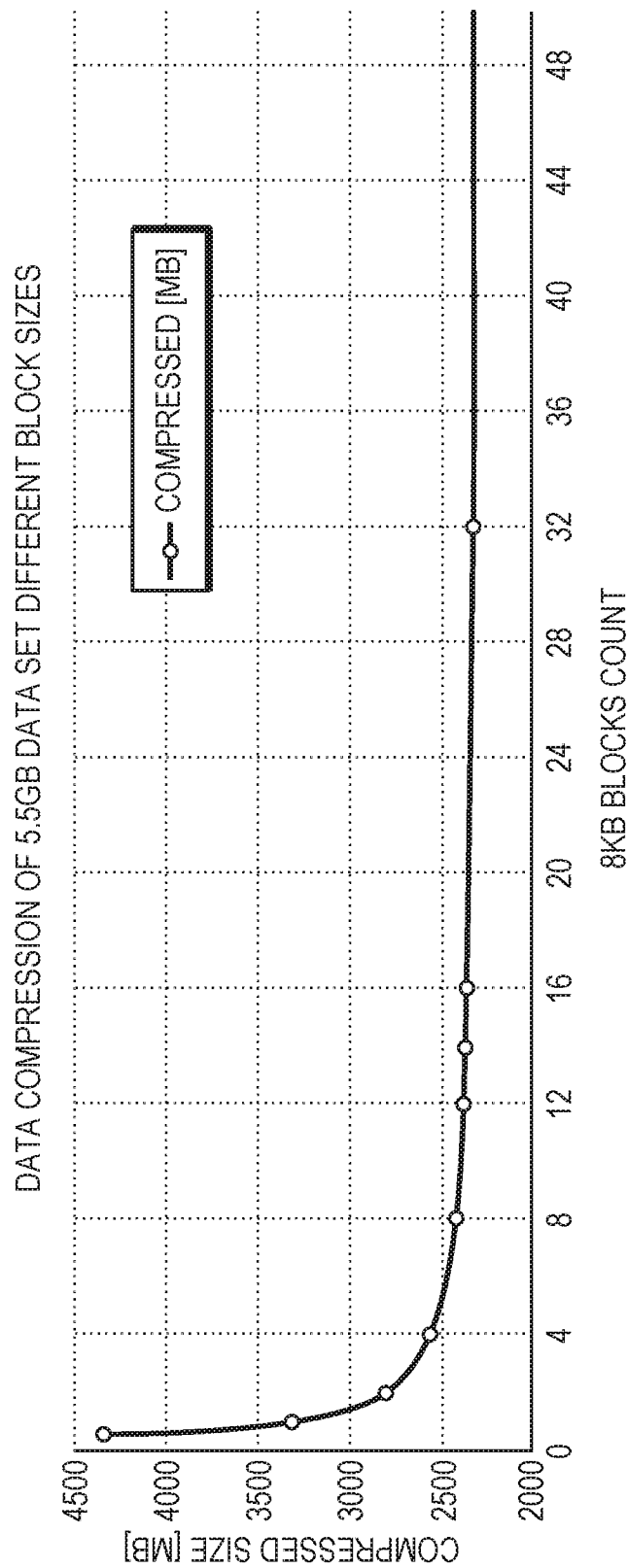
FIG. 4 is a representation of experimental data regarding data reductions achieved through compression of data blocks of different sizes.

Moreover, in general, larger amounts of data are compressed more effectively than smaller amounts; the longer the sequence of data, the higher the probability that the sequence will repeat the same sub-sequences of data. In at least one experiment conducted in accordance with the current technique, compressing 5.5 GB of data in blocks of 4 KB reduced the data by 21%, whereas compressing via blocks of 8 KB achieved reductions of 40%. Further results of the experiments, as depicted in the graph of FIG. 4, demonstrate that using even larger blocks of data result in greater storage savings, although the benefits of increasing block size diminish after 128 KB. In light of such developments, the inventors recognized that compressing larger amounts of data with comparable entropy could improve data reduction in storage systems, compared to the prior art. As a result, many embodiments of the current technique group together chunks of data, based on entropy, to increase the amount of data to be compressed together and thereby achieve greater savings in storage.

Furthermore, entropy bears upon the likelihood that deduplication will yield significant reductions in data. If data has high entropy, the sub-sequences of data found within exhibit more randomness, which diminishes the probability that the data storage system has previously encountered such sub-sequences. Although sub-sequences contained in data with lower entropy may have higher probabilities of being previously encountered by the data storage system, the lower entropy does not guarantee that deduplication will be successful. Consequently, various embodiments of the current technique use the entropy of data in deciding whether to apply or forgo deduplication.

In considering how entropy impacts the potential effectiveness of data reduction techniques, in some embodiments of the current technique, entropy may be used in different ways to guide how such techniques may be applied to data stored in the cache. In some embodiments of the current technique, by comparing the entropy of stored chunks, a variable number of chunks may be grouped together into a block. In some embodiments of the current technique, the entropy of the variable-sized block may be compared to a threshold to determine whether the block should be deduplicated, or compressed without deduplication. Should deduplication be applied, the entropy of the remaining data in the block may be recalculated to determine whether such data should be compressed prior to storage.

In at least some implementations in accordance with the techniques as described herein, the use of managing inline data compression and deduplication in storage systems techniques can provide one or more of the following advantages: improving IO performance in a storage system by allocating processor resources to data reduction when such techniques are likely to yield worthwhile savings in storage; improving storage system efficiency by increasing the size of a block to compress, thereby increasing the compression ratio; improving storage system efficiency by grouping chunks of data that are readily compressible together; and increasing the effectiveness of deduplication techniques.

FIG. 1 depicts an exemplary embodiment of a computer system that may utilize the techniques described herein. Here, multiple host computing devices ("hosts") 110, shown as devices 110(1) through 110(N), access a data storage system 116 over a network 114. The data storage system 116 includes a storage processor, or "SP," 120 and storage 180. In an example, the storage 180 includes multiple disk drives, such as magnetic disk drives, electronic flash drives, optical drives, and/or other types of drives. Such disk drives may be arranged in RAID (Redundant Array of Independent/Inexpensive Disks) groups, for example, or in any other suitable way.

In an example, the data storage system 116 includes multiple SPs, like the SP 120 (e.g., a second SP, 120*a*). The SPs may be provided as circuit board assemblies, or "blades," which plug into a chassis that encloses and cools the SPs. The chassis may have a backplane for interconnecting the SPs, and additional connections may be made among SPs using cables. No particular hardware configuration is required, however, as any number of SPs, including a single SP, may be provided and the SP 120 can be any type of computing device capable of processing host IOs.

The network 114 may be any type of network or combination of networks, such as a storage area network (SAN), a local area network (LAN), a wide area network (WAN), the Internet, and/or some other type of network or combination of networks, for example. The hosts 110(1-N) may connect to the SP 120 using various technologies, such as Fibre Channel, iSCSI, NFS, SMB 3.0, and CIFS, for example. Any number of hosts 110(1-N) may be provided, using any of the above protocols, some subset thereof, or other protocols besides those shown. As is known, Fibre Channel and iSCSI are block-based protocols, whereas NFS, SMB 3.0, and CIFS are file-based protocols. The SP 120 is configured to receive IO (input/output) requests 112(1-N) according to block-based and/or file-based protocols and to respond to such IO requests 112(1-N) by reading and/or writing the storage 180.

As further shown in FIG. 1, the SP 120 includes one or more communication interfaces 122, a set of processing units 124, compression hardware 126, and memory 130. The communication interfaces 122 may be provided, for example, as SCSI target adapters and/or network interface adapters for converting electronic and/or optical signals received over the network 114 to electronic form for use by the SP 120. The set of processing units 124 includes one or more processing chips and/or assemblies. In a particular example, the set of processing units 124 includes numerous multi-core CPUs.

The compression hardware 126 includes dedicated hardware, e.g., one or more integrated circuits, chipsets, sub-assemblies, and the like, for performing data compression and decompression in hardware. The hardware is "dedicated" in that it does not perform general-purpose computing but rather is focused on compression and decompression of data. In some examples, compression hardware 126 takes the form of a separate circuit board, which may be provided as a daughterboard on SP 120 or as an independent assembly that connects to the SP 120 over a backplane, midplane, or set of cables, for example.

The memory 130 includes both volatile memory (e.g., RAM), and non-volatile memory, such as one or more ROMs, disk drives, solid state drives, and the like. The set of processing units 124 and the memory 130 together form control circuitry, which is constructed and arranged to carry out various methods and functions as described herein. Also, the memory 130 includes a variety of software constructs realized in the form of executable instructions. When the executable instructions are run by the set of processing units 124, the set of processing units 124 are caused to carry out the operations of the software constructs. Although certain software constructs are specifically shown and described, it is understood that the memory 130 typically includes many other software constructs, which are not shown, such as an operating system, various applications, processes, and daemons.

As further shown in FIG. 1, the memory 130 "includes," i.e., realizes by execution of software instructions, a cache 132, an inline compression (ILC) engine 140, an inline decompression (ILDC) engine 150, and a data object 170. A compression policy 142 provides control input to the ILC engine 140, and a decompression policy 152 provides control input to the ILDC engine 150. Both the compression policy 142 and the decompression policy 152 receive performance data 160, which describe a set of operating conditions in the data storage system 116.

In an example, the data object 170 is a host-accessible data object, such as a LUN (Logical Unit), a file system, or a virtual machine disk (e.g., a VVol, available from VMWare, Inc. of Palo Alto, Calif.). The SP 120 exposes the data object 170 to hosts 110 for reading, writing, and/or other data operations. In one particular, non-limiting example, the SP 120 runs an internal file system and implements data object 170 within a single file of that file system. In such an example, the SP 120 includes mapping (not shown) to convert read and write requests from hosts 110 (e.g., IO requests 112(1-N)) to corresponding reads and writes to the file in the internal file system.

As further shown in FIG. 1, ILC engine 140 includes a software component (SW) 140a and a hardware component (HW) 140b. The software component 140a includes a compression method, such as an algorithm, which may be implemented using software instructions. Such instructions may be loaded in memory and executed by processing units 124, or some subset thereof, for compressing data directly, i.e., without involvement of the compression hardware 126. In comparison, the hardware component 140b includes software constructs, such as a driver and API (application programmer interface) for communicating with compression hardware 126, e.g., for directing data to be compressed by the compression hardware 126. In some examples, either or both components 140a and 140b supports multiple compression algorithms. The compression policy 142 and/or a user may select a compression algorithm best suited for current operating conditions, e.g., by selecting an algorithm that produces a high compression ratio for some data, by selecting an algorithm that executes at high speed for other data, and so forth.

For decompressing data, the ILDC engine 150 includes a software component (SW) 150a and a hardware component (HW) 150b. The software component 150a includes a decompression algorithm implemented using software instructions, which may be loaded in memory and executed by any of processing units 124 for decompressing data in software, without involvement of the compression hardware 126. The hardware component 150b includes software constructs, such as a driver and API for communicating with compression hardware 126, e.g., for directing data to be decompressed by the compression hardware 126. Either or both components 150a and 150b may support multiple decompression algorithms. In some examples, the ILC engine 140 and the ILDC engine 150 are provided together in a single set of software objects, rather than as separate objects, as shown.

In example operation, hosts 110(1-N) issue IO requests 112(1-N) to the data storage system 116 to perform reads and writes of data object 170. SP 120 receives the IO requests 112(1-N) at communications interface(s) 122 and passes them to memory 130 for further processing. Some IO requests 112(1-N) specify data writes 112W, and others specify data reads 112R. Cache 132 receives write requests 112W and stores data specified thereby in cache elements 134. In a non-limiting example, the cache 132 is arranged as a circular data log, with data elements 134 that are specified in newly-arriving write requests 112W added to a head and with further processing steps pulling data elements 134 from a tail. In an example, the cache 132 is implemented in DRAM (Dynamic Random Access Memory), the contents of which are mirrored between SPs 120 and 120a and persisted using batteries. In an example, SP 120 may acknowledge writes 112W back to originating hosts 110 once the data specified in those writes 112W are stored in the cache 132 and mirrored to a similar cache on SP 120a. It should be appreciated that the data storage system 116 may host multiple data objects, i.e., not only the data object 170, and that the cache 132 may be shared across those data objects.

When the SP 120 is performing writes, the ILC engine 140 selects between the software component 140a and the hardware component 140b based on input from the compression policy 142. For example, the ILC engine 140 is configured to steer incoming write requests 112W either to the software component 140a for performing software compression or to the hardware component 140b for performing hardware compression.

In an example, cache 132 flushes to the respective data objects, e.g., on a periodic basis. For example, cache 132 may flush element 134U1 to data object 170 via ILC engine 140. In accordance with compression policy 142, ILC engine 140 selectively directs data in element 134U1 to software component 140a or to hardware component 140b. In this example, compression policy 142 selects software component 140a. As a result, software component 140a receives the data of element 134U1 and applies a software compression algorithm to compress the data. The software compression algorithm resides in the memory 130 and is executed on the data of element 134U1 by one or more of the processing units 124. Software component 140a then directs the SP 120 to store the resulting compressed data 134C1 (the compressed version of the data in element 134U1) in the data object 170. Storing the compressed data 134C1 in data object 170 may involve both storing the data itself and storing any metadata structures required to support the data 134C1, such as block pointers, a compression header, and other metadata.

It should be appreciated that this act of storing data 134C1 in data object 170 provides the first storage of such data in the data object 170. For example, there was no previous storage of the data of element 134U1 in the data object 170. Rather, the compression of data in element 134U1 proceeds "inline" because it is conducted in the course of processing the first write of the data to the data object 170.

Continuing to another write operation, cache 132 may proceed to flush element 134U2 to data object 170 via ILC engine 140, which, in this case, directs data compression to hardware component 140b, again in accordance with policy 142. As a result, hardware component 140b directs the data in element 134U2 to compression hardware 126, which obtains the data and performs a high-speed hardware compression on the data. Hardware component 140b then directs the SP 120 to store the resulting compressed data 134C2 (the compressed version of the data in element 134U2) in the data object 170. Compression of data in element 134U2 also takes place inline, rather than in the background, as there is no previous storage of data of element 134U2 in the data object 170.

In an example, directing the ILC engine 140 to perform hardware or software compression further entails specifying a particular compression algorithm. The algorithm to be used in each case is based on compression policy 142 and/or specified by a user of the data storage system 116. Further, it should be appreciated that compression policy 142 may operate ILC engine 140 in a pass-through mode, i.e., one in which no compression is performed. Thus, in some examples, compression may be avoided altogether if the SP 120 is too busy to use either hardware or software compression.

In some examples, storage 180 is provided in the form of multiple extents, with two extents E1 and E2 particularly shown. In an example, the data storage system 116 monitors a "data temperature" of each extent, i.e., a frequency of read and/or write operations performed on each extent, and selects compression algorithms based on the data temperature of extents to which writes are directed. For example, if extent E1 is "hot," meaning that it has a high data temperature, and the data storage system 116 receives a write directed to E1, then compression policy 142 may select a compression algorithm that executes at high speed for compressing the data directed to E1. However, if extent E2 is "cold," meaning that it has a low data temperature, and the data storage system 116 receives a write directed to E2, then compression policy 142 may select a compression algorithm that executes at high compression ratio for compressing data directed to E2.

When SP 120 performs reads, the ILDC engine 150 selects between the software component 150a and the hardware component 150b based on input from the decompression policy 152 and also based on compatible algorithms. For example, if data was compressed using a particular software algorithm for which no corresponding decompression algorithm is available in hardware, the ILDC engine 150 may steer the compressed data to the software component 150a, as that is the only component equipped with the algorithm needed for decompressing the data. However, if both components 150a and 150b provide the necessary algorithm, then selection among components 150a and 150b may be based on decompression policy 152.

To process a read request 112R directed to compressed data 136C, the ILDC engine 150 accesses metadata of the data object 170 to obtain a header for the compressed data 136C. The compression header specifies the particular algorithm that was used to compress the data 136C. The ILDC engine 150 may then check whether the algorithm is available to software component 150a, to hardware component 150b, or to both. If the algorithm is available only to one or the other of components 150a and 150b, the ILDC engine 150 directs the compressed data 136C to the component that has the necessary algorithm. However, if the algorithm is available to both components 150a and 150b, the ILDC engine 150 may select between components 150a and 150b based on input from the decompression policy 152. If the software component 150a is selected, the software component 150a performs the decompression, i.e., by executing software instructions on one or more of the set of processors 124. If the hardware component 150b is selected, the hardware component 150b directs the compression hardware 126 to decompress the data 136C. The SP 120 then returns the resulting uncompressed data 136U to the requesting host 110.

It should be appreciated that the ILDC engine 150 is not required to use software component 150a to decompress data that was compressed by the software component 140a of the ILC engine 140. Nor is it required that the ILDC engine 150 use hardware component 150b to decompress data that was compressed by the hardware component 140b. Rather, the component 150a or 150b may be selected flexibly as long as algorithms are compatible. Such flexibility may be especially useful in cases of data migration. For example, consider a case where data object 170 is migrated to a second data storage system (not shown). If the second data storage system does not include compression hardware 126, then any data compressed using hardware on data storage system 116 may be decompressed on the second data storage system using software.

With the arrangement of FIG. 1, the SP 120 intelligently directs compression and decompression tasks to software or to hardware based on operating conditions in the data storage system 116. For example, if the set of processing units 124 are already busy but the compression hardware 126 is not, the compression policy 142 can direct more compression tasks to hardware component 140b. Conversely, if compression hardware 126 is busy but the set of processing units 124 are not, the compression policy 142 can direct more compression tasks to software component 140a. Decompression policy 152 may likewise direct decompression tasks based on operating conditions, at least to the extent that direction to hardware or software is not already dictated by the algorithm used for compression. In this manner, the data storage system 116 is able to perform inline compression using both hardware and software techniques, leveraging the capabilities of both while applying them in proportions that result in best overall performance.

Figure 2:
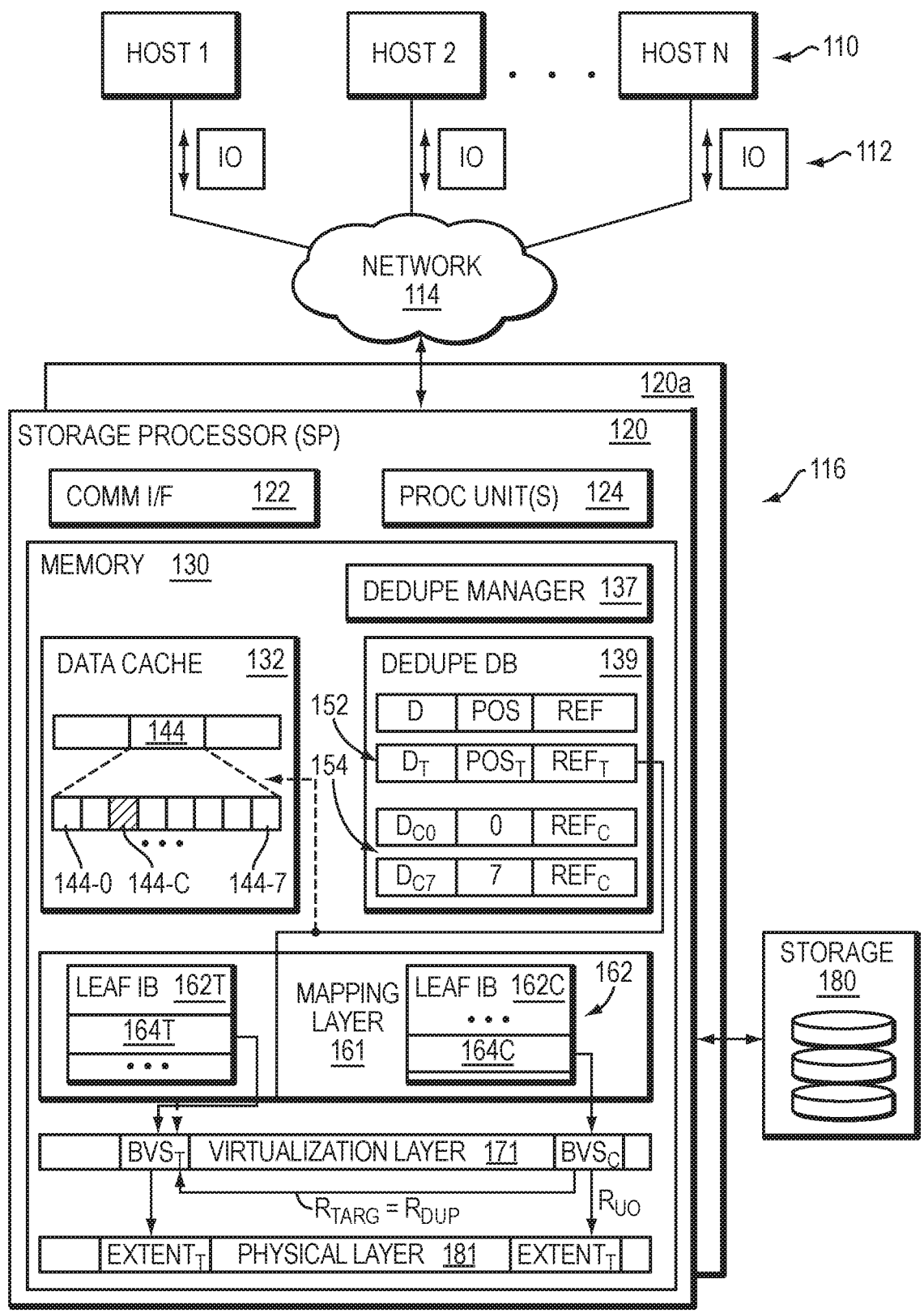

In such an embodiment in which element 120 of FIG. 2 is implemented using one or more data storage systems, each of the data storage systems may include code thereon for performing the techniques as described herein.

Servers or host systems, such as 110(1)-110(N), provide data and access control information through channels to the storage systems, and the storage systems may also provide data to the host systems also through the channels. The host systems may not address the disk drives of the storage systems directly, but rather access to data may be provided to one or more host systems from what the host systems view as a plurality of logical devices or logical volumes (LVs). The LVs may or may not correspond to the actual disk drives. For example, one or more LVs may reside on a single physical disk drive. Data in a single storage system may be accessed by multiple hosts allowing the hosts to share the data residing therein. An LV or LUN (logical unit number) may be used to refer to the foregoing logically defined devices or volumes.

The data storage system may be a single unitary data storage system, such as single data storage array, including two storage processors or compute processing units. Techniques herein may be more generally use in connection with any one or more data storage system each including a different number of storage processors than as illustrated herein. The data storage system 116 may be a data storage array that includes a plurality of data storage devices 116 and at least two storage processors 120a. Additionally, the two storage processors 120a may be used in connection with failover processing when communicating with a management system for the storage system. Client software on the management system may be used in connection with performing data storage system management by issuing commands to the data storage system 116 and/or receiving responses from the data storage system 116 over a connection. In one embodiment, the management system may be a laptop or desktop computer system.

The particular data storage system as described in this embodiment, or a particular device thereof, such as a disk, should not be construed as a limitation. Other types of commercially available data storage systems, as well as processors and hardware controlling access to these particular devices, may also be included in an embodiment.

In some arrangements, the data storage system 116 provides block-based storage by storing the data in blocks of logical storage units (LUNs) or volumes and addressing the blocks using logical block addresses (LBAs). In other arrangements, the data storage system 116 provides file-based storage by storing data as files of a file system and locating file data using inode structures. In yet other arrangements, the data storage system 116 stores LUNs and file systems, stores file systems within LUNs, and so on.

As shown in FIG. 2, the memory 130 also "includes," i.e., realizes by execution of software instructions, a deduplication ("dedupe") manager 137, a deduplication database 139, a mapping layer 161, a virtualization layer 171, and a physical layer 181. The dedupe manager 137 is configured to manage deduplication activities. The data cache 132 may be realized in volatile memory (e.g., RAM) and is configured to store temporarily incoming data arriving from hosts 110. The data cache 132 may also store recently-written and/or read data, to support deduplication. In an example, the data cache 132 defines incoming data from hosts 110 in the form of blocks (such as block 144), where each block is composed of a sequence of portions (e.g., portions 144-0 through 144-7). As is known, a "block" is a unit of storage in a data storage system, which generally corresponds to the smallest unit of storage space that can be allocated. Block sizes vary from one storage system to the next, with typical sizes being 4 KB (kilobytes) or 8 KB, for example. In the particular arrangement shown, there are eight portions of data per block, and the portions are contiguous and uniform in size. For example, if the block size is 4 KB, each portion would be 512 B.

The dedupe database 139 is configured to store digests of portions of data along with associated information. For example, the dedupe database 139 stores, for each portion of data 144, a digest "D" of that portion and a reference ("Ref") to a location, in the data storage system 116, that contained the respective portion of data when the database entry was made. The SP 120 computes each digest as a hash of the respective portion's contents. Thus, different portions produce different digests, with rare hash collisions being possible. The reference Ref may take various forms. For example, Ref may point to a memory location in the data cache 132 where the data block is temporarily being held. Alternatively, Ref may point to metadata (e.g., a block virtualization structure) that maps to the data block, such that a persisted version of the data block may be obtained by following the reference to the pointed-to metadata. In some examples, the reference points directly to the data block, e.g., in the physical layer 181. An entry in the dedupe database 139 may further include a position, "Pos," which indicates a position of the portion of data. For example, if the portion for a database entry was the first portion in the data block that contained it, then the position Pos might be 0. If the portion was the last portion in the data block, then the position might be 7. In some examples, entries in the dedupe database 139 are created only for first and last portions of their parent data blocks, such that there are only two possibilities and Pos may be represented with a single bit. In some examples, the position of a portion may be tracked using a separate bitmap. The bitmap may be arranged by portion and may provide a single bit for each portion, to indicate whether the respective portion is in the first position or in the last position.

Preferably, the dedupe database 139 operates as a memory-resident cache. The cache may employ an LRU (least-recently used) eviction policy. In some examples, when evicting an entry from the dedupe database 139, the SP 120 also evicts the data block referenced by that entry in the data cache 132. In some cases, the dedupe database 139 is backed by persistent storage, with portions read into volatile memory as needed for fast access.

The mapping layer 161 includes metadata for mapping data objects, such as LUNs (Logical Units), file systems, virtual machine disks, and/or the like, which may be managed by a separate namespace layer (not shown). The mapping layer 161 maps each data object to a corresponding set of block virtualization structures ("BVS's") in the virtualization layer 171. In some examples, one BVS is provided for each addressable data block in the storage system. The mapping layer 161 includes indirect blocks ("IB's") 162. Each IB 162 is a block that contains an array of block pointers, such as 1024 block pointers. In an example, IB's 162 are arranged in a tree, or in multiple trees, in which block pointers in parent IB's point to child IB's and thus multiply the total number of BVS's (and therefore data blocks) that can be addressed.

In the virtualization layer 171, the BVS's enable the data storage system 116 to deduplicate physical data blocks and to relocate physical data blocks without having to update block pointers in the mapping layer 161. Block pointer updates would be a very burdensome task, given that block pointers tend to be much more numerous and widely dispersed than are BVS's.

The physical layer 181 manages the physical data blocks of the data storage system 116. For example, the physical layer 181 is denominated in data blocks of uniform size, such as 4 KB, 8 KB, or the like. Each data block is uniquely addressable. The physical layer 181 is configured to store host data as storage extents in the data blocks. The extents may hold compressed data or uncompressed data. Some extents may be smaller than a block, e.g., if the data are compressed and/or if only a portion of a block's data are uniquely stored. One should appreciate that the physical layer 181 is itself a logical structure and that the bits of data are actually stored in devices of the storage 180. The data storage system 116 may include additional layers, which are not shown, such as a RAID (Redundant Array of Independent (or Inexpensive) Disks) layer, additional mapping layers, and the like. The depicted arrangement is intended merely to be illustrative.

In example operation, the hosts 110 issue I/O requests 112 to the data storage system 116. The SP 120 receives the I/O requests 112 at the communication interfaces 122 and initiates further processing. For example, the SP 120 receives sets of incoming data being written by hosts 110 and renders the data in block-sized increments of memory, referred to herein simply as "blocks." The data as received from the hosts is not necessarily block-denominated and may arrive in I/O's of any size. Nevertheless, the data cache 132 may store the arriving data as blocks, which the data cache 132 may realize in buffer caches, for example. The size of the buffer caches is preferably configured to match the block size of the data storage system 116.

To support deduplication of portions of data, the SP 120 defines multiple portions for the defined blocks. For example, the SP 120 renders block 144 as portions 144-0 through 144-7, which are contiguous and uniformly sized. We have recognized that a size of a portion of 512 B is particularly well-suited for deduplication, as many host applications use a portion of data of 512 B as a standard size for performing writes. Although host applications may shift data when writing to the data storage system 116, such shifts tend to appear in increments of 512 B. Performing deduplication at this granularity thus catches many shifted portions that conventional, block-based deduplication would miss. Setting the size of a portion to something different from 512 B is not excluded by the invention, however.

With the portions 144-0 through 144-7 defined, a deduplication attempt begins by attempting to match one or more of the portions to an entry in the dedupe database 139. For example, the dedupe manager 137 receives a candidate portion 144C of the candidate block 144 and generates a digest of the candidate portion 144C, e.g., by applying a hash function to the contents of portion 144C. The dedupe manager 137 then searches the dedupe database 139 for a digest D that matches the computed digest of portion 144C. In a non-limiting example, the dedupe database 139 is constructed as a key-value store, where the digest D forms the key and the reference Ref and position Pos form the value. In such cases, searching for a matching entry in the dedupe database 139 merely entails looking up the value that corresponds to the digest which is applied as the key. If no match is found, the dedupe manager 137 may try a different portion of the candidate block 144. If no match is found after attempting all portions 144-0 through 144-7, then the deduplication attempt fails for the candidate block 144. The SP 120 may then allocate a new storage extent from the physical layer 181 and store the contents of the candidate block 144 in the newly allocated extent.

If the dedupe manager 137 succeeds, however, in finding a matching entry 152 to the candidate portion 144C, then deduplication proceeds. In an example, the matching entry 152 is the entry in the dedupe database 139 for which the digest $D_T$ matches the computed digest of the candidate portion 144C. The digest $D_T$ itself was computed for an earlier processed portion, which we refer to as a "target portion," and was part of an earlier-processed data block, which we refer to as a "target block."

The dedupe manager 137 then follows the reference $Ref_T$ in the matching entry to obtain the target block, which may still reside in the data cache 132 or which may be fetched from storage 180 if it does not. Depending on implementation, the deduplication attempt may fail if there is a cache miss, as fetching the target block from disk may be too time-consuming to be warranted.

Assuming the target block is obtained, the dedupe manager 137 may proceed by confirming the match. For example, the dedupe manager 137 compares the candidate portion 144C with the target portion as read from the target block and tests whether the two are the same, e.g., by performing a data comparison. Note that the matching entry 152 indicates, via $Pos_T$, the position of the target portion in the target block. Thus, the comparison may proceed without having to scan the entire target block.

Assuming the match is confirmed, the dedupe manager 137 may identify the full extent of the match. For example, a match to the target portion may be part of a larger match between the candidate block 144 and the target block. Given the position, $Pos_T$, of the target portion in the target block, the dedupe manager 137 selects a direction in which to search for an extended match. For instance, if the target portion was the first portion in the target block, then the search should proceed in the forward direction. But if the target portion was the last portion in the target block, the search should proceed in the reverse direction. The dedupe manager 137 proceeds in the indicated direction, comparing bytes of the candidate block 144 with corresponding bytes of the target block, until an end of the candidate block 144 is reached or until the bytes of the two blocks no longer match. The dedupe manager 137 then identifies a boundary between a duplicate range of the candidate block, $R_{DUP}$, which is shared with a target range $R_{TARG}$ of the target block, and a unique range of the candidate block $R_{UQ}$, which is unique to the candidate block 144. Some block comparisons may yield two unique ranges, one before the duplicate range $R_{DUP}$ and one after.

Next, the dedupe manager 137 effects persistent storage of the candidate block 144, in a manner that efficiently accounts for both the duplicate range $R_{DUP}$ and the unique range $R_{UQ}$ (or unique ranges). In the example shown, the data storage system 116 has already stored the target block, along with metadata to support it. For example, SP 120 already configured a block pointer 164T in a leaf IB 162T in the mapping layer 161. The block pointer 164T is already configured to point to $BVS_T$ in the virtualization layer 171. $BVS_T$ in turn points to $Extent_T$, which stores the target block in the physical layer 181. Now, to support storage of the candidate block 144, the mapping layer 161 configures a block pointer 164C in leaf IB 162C. The block pointer 164C points to $BVS_C$, which is made to point to two different locations. The first location is the address of $\text{Extent}_C$, which is designated for storing the unique range (or ranges), $R_{UQ}$, of the candidate block. The second location is the address of $\text{BVS}_T$, i.e., the BVS that points to the target block and contains the duplicate range, $R_{DUP}$. When pointing to $\text{BVS}_T$, the metadata in $\text{BVS}_C$ may specify the range $R_{TARG}$ of the target block that contains the shared data, such as by offset and length. The SP 120 may then store the unique range $R_{UQ}$ in $\text{Extent}_C$. The stored data may be compressed, if desired.

The described operations thus effect storage of the candidate block 144 while consuming only the amount of storage space required to support the unique range, $R_{UQ}$, which may be as small as a single portion of 512 B, or smaller if compressed. Some additional metadata may be needed, but the additional metadata is small compared with the amount of storage space conserved.

One significant feature of the described technique is that it combines digest-based lookups of portions with data comparisons of data. In some circumstances, this arrangement allows data to be deduplicated at levels even smaller than the size of a portion. For example, when comparing the candidate block 144 with the target block, the dedupe manager 137 may operate with arbitrarily high precision. Thus, the dedupe manager 137 can identify boundaries between duplicate ranges and unique ranges with precision as high as a single byte. It should be noted that "a portion" may indicate a sector, a set of data blocks, a chunk of data blocks of varying size or any other portion of data.

Because the described technique uses data comparisons as part of its processing, the act of confirming that there are no hash collisions is a simple matter, as the target block and candidate block are already being compared. Some embodiments leverage this feature by using relatively small digests in the dedupe database 139, such as digests having fewer than 128 bits. Although long digests can reduce the risk of hash collisions to nearly zero, they are complex to compute and can place high burdens on processor cores. As the disclosed technique compares the blocks as part of its regular processing, the technique is tolerant to hash collisions. Should a hash collision (false positive match) occur, the collision will be detected by data comparison and treated as a non-match. In such cases, the dedupe manager 137 can simply try again or move on to the next portion of the candidate block, attempting to match that one.

Also, one should appreciate that deduplication of portions of blocks is also capable of matching entire blocks. For instance, if a data comparison of a candidate block to a target block results in a duplicate range $R_D$UP the size of the entire block, with a unique range $R_{UQ}$ of zero size, then the entire block is matched and no unique range needs to be stored.

One might observe that duplication of portions of blocks generally requires a greater number of digest lookups than does block-based deduplication. However, the use of smaller digests can help to offset the increased number of lookups. Also, implementations may limit the cost of lookups where no match is found by using Bloom filters, for example.

Although data comparisons are the general rule, it can be avoided in some circumstances. For instance, if the candidate portion is in the first position of the candidate block (like portion 144-0), and the position indicator $\text{Pos}_T$ of the matching entry 152 indicates the last position in the target block, then the match cannot be extended as there is no possibility of there being additional shared content. The match would thus be limited to the matching portion, and a data comparison is avoided.

The dedupe manager 137 may also play a role in loading the dedupe database 139 with new content. For instance, as the data cache 132 receives new host data and defines new blocks, the dedupe manager 137 may access those blocks and create new database entries for one or more of their portions. Creating new entries for all portions of each newly defined block is certainly an option, but we have recognized that it is generally sufficient to create entries for only the first and the last portions, e.g., 144-0 and 144-7. In the example shown, the dedupe manager 137 has created new database entries for portions 144-0 and 144-7. Each entry includes a digest hash of the respective portion ($D_{C0}$ or $D_{C7}$), a position (0 or 7) of the respective portion in the candidate block 144, and a reference $\text{Ref}_C$ to the candidate block 144, which may be a pointer to the buffer cache that stores the candidate block 144 in the data cache 132.

A rationale behind limiting new database entries to first and last portions is that data shifts (by increments of 512 B) are common, but data inserts are expected to be relatively rare. Recording entries for the first and last portions ensures that shifted data will produce at least one portion match. In some cases, new portion entries are avoided for portions that are already recorded in entries of the dedupe database 139.

Figure 3:
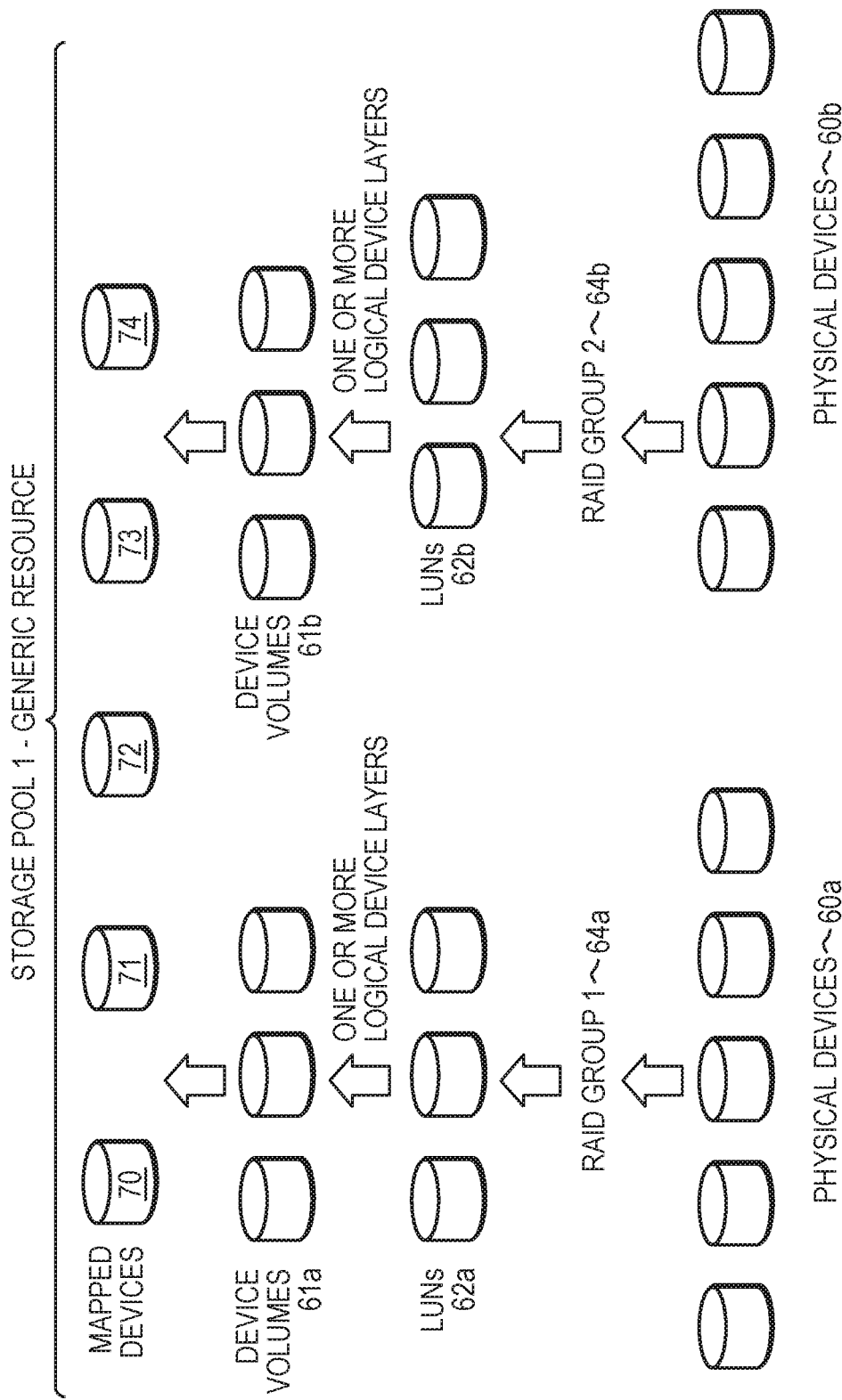
FIG. 3 is an example illustrating storage device layout.

Referring to FIG. 3, shown is an example representing how data storage system 16 best practices may be used to form storage pools. The example 50 illustrates how storage pools may be constructed from groups of physical devices. For example, RAID Group 1 64*a* may be formed from physical devices 60*a*. The data storage system best practices of a policy may specify the particular disks and configuration for the type of storage pool being formed. For example, for physical devices 60*a* on a first data storage system type when forming a storage pool, RAID-5 may be used in a 4+1 configuration (e.g., 4 data drives and 1 parity drive). The RAID Group 1 64*a* may provide a number of data storage LUNs 62*a*. An embodiment may also utilize one or more additional logical device layers on top of the LUNs 62*a* to form one or more logical device volumes 61*a*. The particular additional logical device layers used, if any, may vary with the data storage system. It should be noted that there may not be a 1-1 correspondence between the LUNs of 62*a* and the volumes of 61*a*. In a similar manner, device volumes 61*b* may be formed or configured from physical devices 60*b*. The storage pool 1 of the example 50 illustrates two RAID groups being used to define a single storage pool although, more generally, one or more RAID groups may be used to form a storage pool in an embodiment using RAID techniques.

The data storage system 12 may also include one or more mapped devices 70-74. A mapped device (e.g., "thin logical unit", "direct logical unit") presents a logical storage space to one or more applications running on a host where different portions of the logical storage space may or may not have corresponding physical storage space associated therewith. However, the mapped device is not mapped directly to physical storage space. Instead, portions of the mapped storage device for which physical storage space exists are mapped to data devices such as device volumes 61*a*-61*b*, which are logical devices that map logical storage space of the data device to physical storage space on the physical devices 60*a*-60*b*. Thus, an access of the logical storage space of the mapped device results in either a null pointer (or equivalent) indicating that no corresponding physical storage space has yet been allocated, or results in a reference to a data device which in turn references the underlying physical storage space. A disk may be a physical disk within the storage system. A LUN may be a logical unit number which is an identifier for a Logical Unit. Each slice of data may have a mapping to the location of the physical drive where it starts and ends.

Figure 5:
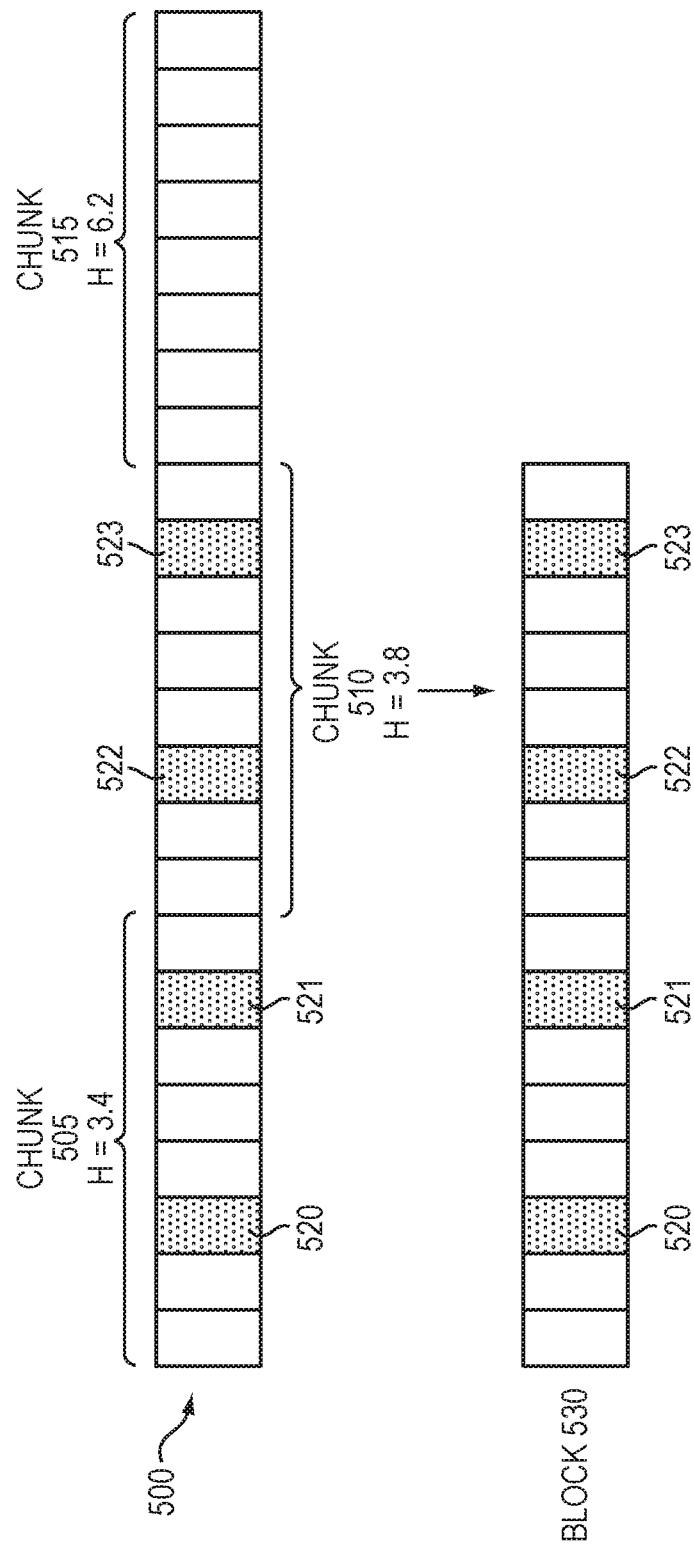

FIG. 5 illustrates, according to at least one exemplary embodiment of the current technique, how entropy may be used to identify a block of data 530 from data 500 stored in a cache 132. The data 500 may be subdivided into sequential chunks, such as chunks 505, 510, and 515, and the storage processor 120 may group one or more chunks 505, 510, and 515 into a variable-sized block 530 for further processing via compression and/or deduplication. Advantageously, this ability of the data storage system 116 to vary the size of data block 530 enables the storage processor 120 to exploit redundancies that may be found in larger amounts of data. As a result, the data storage system 116 can achieve greater data reduction, and consequently greater savings in storage, over a conventional system.

In at least some embodiments of the current technique, the storage processor 120 calculates the entropy for each chunk 505, 510, 515 stored in the cache 132. For example, the storage processor 120 may apply its formula for entropy to all of the data in a chunk 505, 510, 515. Alternatively, the storage processor 120 first determines the entropy for each portion of a chunk 505, 510, 515, and then averages the entropies. In at least some embodiments of the current technique, the storage processor 120 may calculate the entropy for each 512 B increment of a chunk 505, 510, 515, although increments of different sizes may be used.

The storage processor 120 may apply a formula for Shannon-based information entropy, which outputs values between zero (0) and eight (8). Low values for Shannon entropy, i.e., values closer to zero (0), signify that the data is more orderly or non-random. High values, i.e., values closer to eight (8), signify that the data is more random or non-uniform. In some embodiments, the storage processor 120 may apply the following formula:

$$H = -\sum_{i=0}^{255} P_i \log_2(P_i)$$

In this formula, $P_n$=(number of n-valued bytes)/(total number of bytes), i.e., the probability that the dataset includes bytes of n-value.

To identify the data block 530, the storage processor 120 examines the entropies of chunks 505, 510, 515 stored in the cache 132. The storage processor 120 compares the entropy of each chunk 505, 510, 515 to a threshold. If the entropy falls below the threshold, the storage processor 120 includes the chunk 505, 510 in the data block 530. Although the example depicted in FIG. 5 represents the chunks 505, 510, 515 as stored contiguously in the cache 132, the data block 530 need not be limited to contiguous chunks 505, 510. In some embodiments, the storage processor 120 includes chunks 505, 510 that are stored in the cache 132 within a predetermined period of time. Thus, all of the chunks 505, 510 in the same data block 530 have temporal locality, even if the chunks 505, 510 have been stored in different portions of the cache 132. Consequently, when the data block 530 is later retrieved from storage and loaded into the cache 132, read requests received by the data storage system 116 are more likely to access the various chunks 505, 510 that now reside in the cache 132.

In at least some embodiments of the current technique, when the storage processor 120 encounters a chunk 515 whose entropy exceeds the threshold, the chunk 515 is not included in the data block 530. The chunk 515 whose entropy exceeds the threshold is added to a new, separate data block, or forms its own data block.

In one example, as applied to the data 500 represented in FIG. 5, the threshold may be 4.0. In applying this threshold to chunks 505, 510, 515, the storage processor 120 determines that chunks 505 and 510 have entropies below 4.0 (i.e., 3.4 and 3.8, respectively), and includes the chunks 505, 510 in the data block 530. Because the entropy of the chunk 515 is 6.2, the storage processor 120 excludes this chunk 515 from the data block 530.

Although the example above uses a threshold of 4.0, this value is merely exemplary, and thresholds of other values may be used. In at least some embodiments of the current technique, the threshold is based on a level of compression. The user may select the level of compression, or the level may be pre-programmed into the compression hardware 126 or determined by the compression policy 142. In other embodiments of the current technique, the data storage system 116 dynamically revises the threshold. For example, the data storage system 116 may run analytics on data reduction and I/O performance obtained from using the current value of the threshold, and adjust the threshold based on the assessment.

Instead of comparing the entropy of chunks 505, 510, 515 to a threshold, the storage processor 120 adds chunks 505, 510 of similar entropy to the same data block 530. For example, chunks 505, 510 may be included in the same data block 530 if their entropies fall within a particular percentage of one another. Suppose that, in an exemplary embodiment, this percentage is 15%. Returning to the data 500 depicted in FIG. 5, the entropy of chunk 510 falls within 15% of the entropy of chunk 505. Consequently, the storage processor 120 adds chunks 505 and 510 to the data block 530. Because the entropy of chunk 515 exceeds the entropy of chunk 510 by more than 15%, the storage processor 120 excludes chunk 515 from the data block 530. This approach to assessing the similarity of chunks' entropies is merely exemplary; various other measures of similarity may also be used.

In at least some embodiments of the current technique, the smallest data block 530 includes a single chunk. A chunk may include 4 KB or 8 KB of data, although chunks of other sizes may also be used. Because some embodiments of the current technique permit the size of the data block 530 to vary, the data storage system 116 need not limit the size of any given block 530. However, in many embodiments of the current technique, the storage processor 120 may nevertheless limit a data block 530 to a particular size, such as 128 KB. Thus, many embodiments of the current technique, the data storage system 116 permit data blocks 530 ranging from 4 KB-128 KB in size. Should the storage processor 120 encounter more than 128 KB of data 500 that has been stored in the cache 132 within a predetermined window of time, whose entropy falls below the threshold, the first 128 KB may be recognized as a data block 530, while the remaining data may be reserved for a new, separate data block. In at least some embodiments of the current technique, the storage processor 120 may group together thirty-two (32) chunks of 4 KB each, or sixteen (16) chunks of 8 KB each, to form a data block 530 of 128 KB. However, the storage processor 120 may group together chunks to form blocks 530 of any other size.

Figure 6:
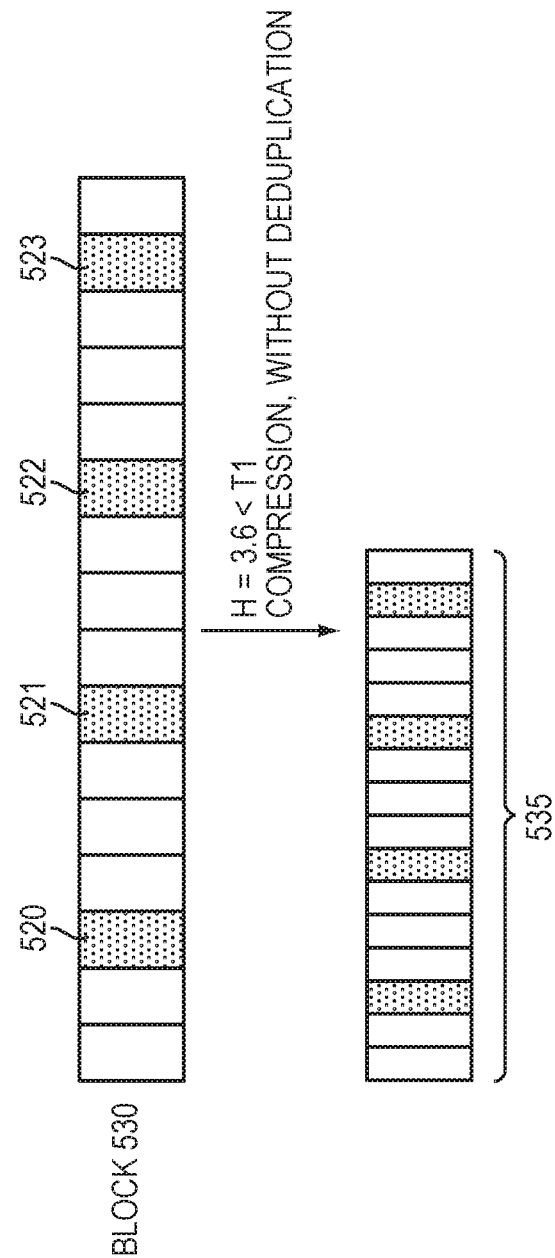
Figure 7:
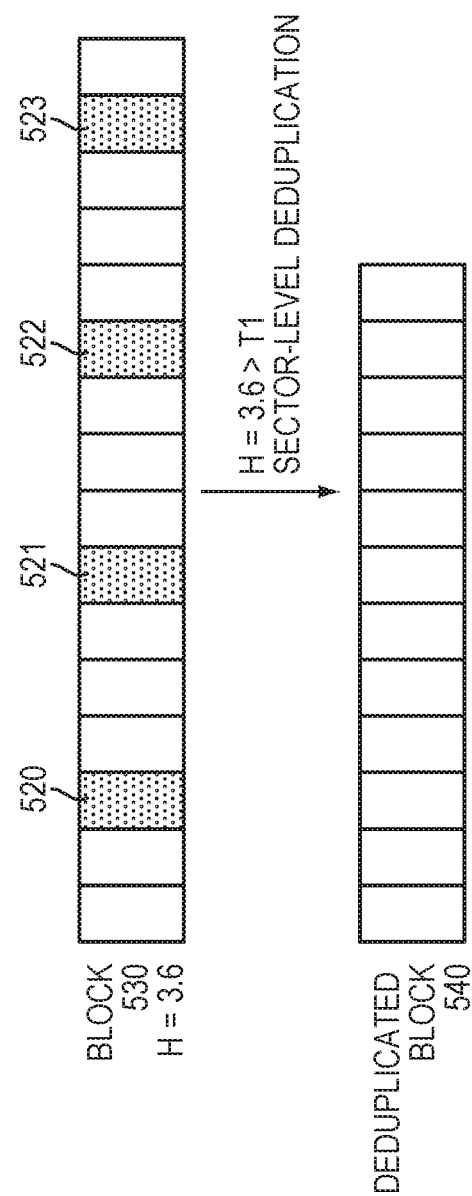

FIGS. 6 and 7 illustrate, according to at least one exemplary embodiment of the current technique, how entropy for the data block 530 may be used to determine whether the data block 530 should be deduplicated, or compressed without deduplication. As described above herein, data with low entropy is generally more compressible than data with high entropy. Additionally, although data is more likely to be deduplicated successfully if it exhibits low entropy, low entropy itself does not guarantee that applying deduplication techniques will reduce data by any significant amount. Thus, in some situations, compressing low entropy-data that has not been deduplicated can result in comparable, or even superior, data reduction, compared to deduplication of the same data. Advantageously, in at least some embodiments of the current technique, data storage system 116 identify such situations to forgo deduplication and simply compress data blocks 530, so as to produce sufficient levels of data reduction while minimizing sacrifices in data storage system 116 performance.

The storage processor 120 may determine the entropy of the data block 530. In at least some embodiments of the current technique, the storage processor 120 averages the entropy of each chunk 505, 515 in the data block 530. Alternatively, entropy is re-calculated based on the data in the block 530, regardless of the chunk 505, 510 in which the data resides. The storage processor 120 compares the entropy of the data block 530 to a threshold. If the data block's 530 entropy falls below the threshold, compressing its data may yield data reduction comparable or superior to deduplication. As shown in the example of FIG. 6, compressed data 535 of the data block 530 requires less storage than the data block 530 when deduplicated (i.e., deduplicable increments 520, 521, 522, 523 are removed). In at least some embodiments of the current technique, deduplicating the increments 520, 521, 522, 523 might result in less data than compressing the data block 530 without prior deduplication, but the difference in saved storage space would be inadequate compared to the processor resources required for deduplication. In these situations, the storage processor 120 forgoes the processing cycles needed to perform deduplication and compresses the data block 530, flushing the compressed data 535 to storage thereafter.

If the data block's 530 entropy exceeds the threshold, compression is unlikely to yield comparable storage savings as deduplication. In these situations, the storage processor 120 deduplicates the data block 530 to produce deduplicated block 540. In general, deduplication is more effective when performed using smaller increments of data because the likelihood of missing deduplication opportunities due to misaligned data is lower. In many embodiments, deduplication is performed on increments of 512 B of data. Although embodiments of the data storage system 116 use increments of 512 B, increments of other sizes may also be implemented.

Figure 8:
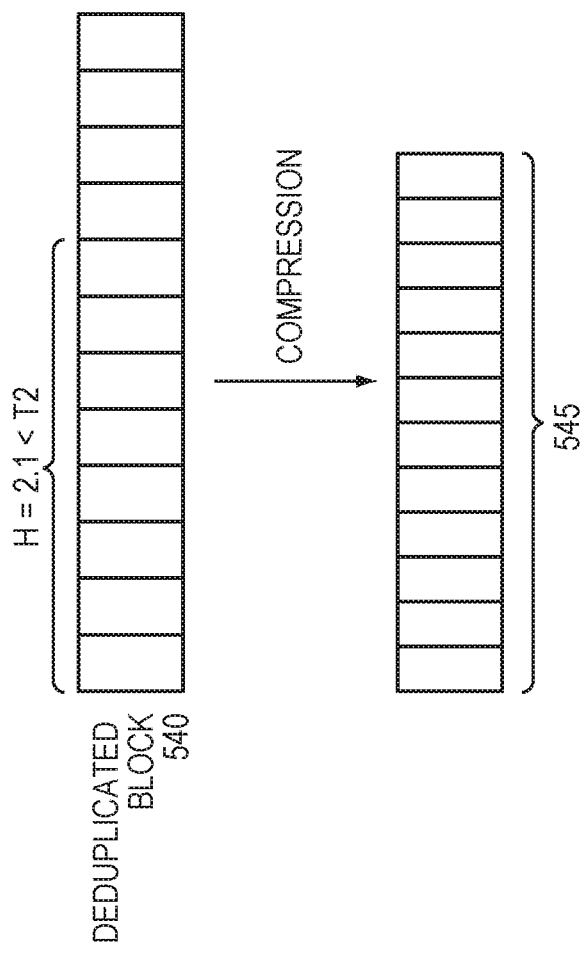

Because deduplication removes data from the block 530, the process alters the entropy of the remaining data 540. If the deduplicated block 540 has high entropy, the data may not be sufficiently redundant for compression to be cost effective. FIGS. 8 and 9 illustrate, according to at least one exemplary embodiment of the current technique, how entropy for the deduplicated block 540 may be used to determine whether the deduplicated block 540 should be compressed prior to storage.

The storage processor 120 determines the entropy of the deduplicated block 540. In at least some embodiments of the current technique, entropy is re-calculated based on the remaining data in the block 540. In other embodiments of the current technique, the storage processor 120 determines the entropy of separate portions of the deduplicated block 540 and averages the calculations. Each portion may be 512 B, though portions of other sizes may also be used. The storage processor 120 compares the entropy of the deduplicated block 540 to another threshold. If the block's 540 entropy falls below the threshold, compression is likely to be effective and the storage processor 120 compresses the deduplicated block 540 prior to storage. Otherwise, the storage processor 120 directly flushes the deduplicated block 540 to storage.

Figure 10A:
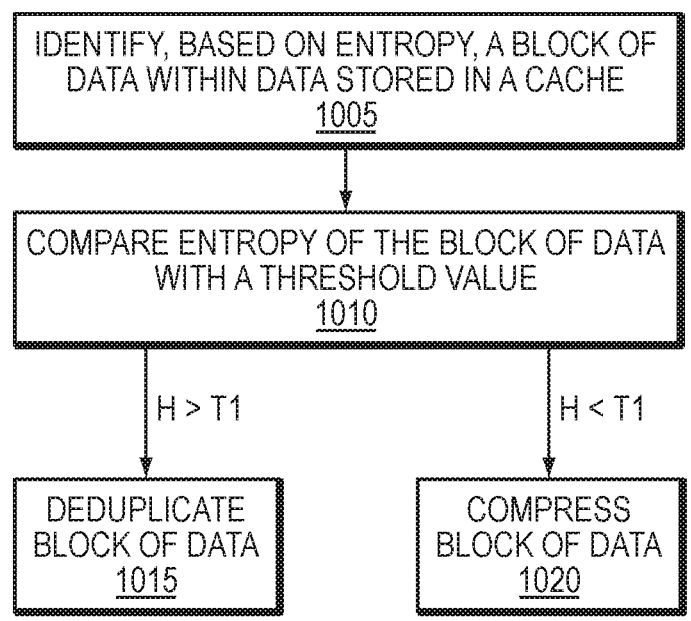
FIGS. 10A and 10B depict flow diagrams illustrating managing inline data compression and deduplication in a data storage system.
Figure 10B:
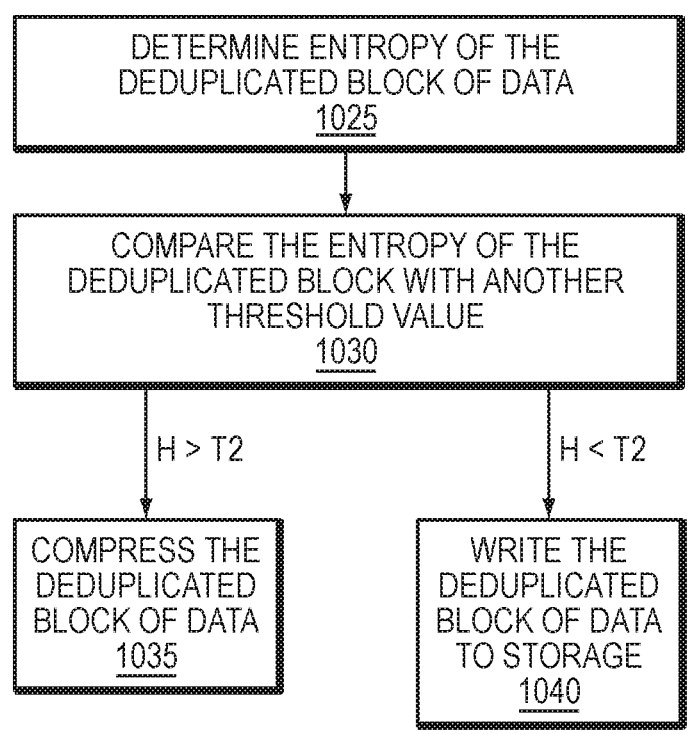

FIGS. 10A and 10B depict flow diagrams illustrating managing inline data compression and deduplication in a storage system. With reference also to FIGS. 1 and 2, in at least one embodiment of the current technique, a storage system identifies, based on entropy, a block of data from data stored in a cache (step 1005). Further, the storage system compares entropy of the block of data with a first threshold value (step 1010). Based on the comparison, the storage system either deduplicates the block of data (step 1015) or compresses the block of data without deduplication (step 1020). If the storage system deduplicates the block of data, the storage system determines the entropy of the deduplicated block of data (step 1025), and compares this entropy with another threshold value (step 1030). Based on the comparison, the storage system either compresses the deduplicated block of data (step 1035) or writes the deduplicated block of data to storage without compression (step 1040).

It should again be emphasized that the implementations described above are provided by way of illustration, and should not be construed as limiting the present invention to any specific embodiment or group of embodiments. For example, the invention can be implemented in other types of systems, using different arrangements of processing devices and processing operations. Also, message formats and communication protocols utilized may be varied in alternative embodiments. Moreover, various simplifying assumptions made above in the course of describing the illustrative embodiments should also be viewed as exemplary rather than as requirements or limitations of the invention. Numerous alternative embodiments within the scope of the appended claims will be readily apparent to those skilled in the art.

Furthermore, as will be appreciated by one skilled in the art, the present disclosure may be embodied as a method, system, or computer program product. Accordingly, the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present disclosure may take the form of a computer program product on a computer-usable storage medium having computer-usable program code embodied in the medium.

The flowchart and block diagrams in the figures illustrate the architecture, functionality, and operation of possible implementations of systems, methods and computer program products according to various embodiments of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof.

While the invention has been disclosed in connection with preferred embodiments shown and described in detail, their modifications and improvements thereon will become readily apparent to those skilled in the art. Accordingly, the spirit and scope of the present invention should be limited only by the following claims.

What is claimed is:

1. A method for use in managing inline data compression and deduplication in storage systems, the method comprising:
    identifying, based on entropy, a block of data from data stored in a cache of a storage system;
    comparing entropy of the block of data with a first threshold value;
    based on the comparison, either deduplicating the block of data or compressing the block of data without deduplication.

2. The method of claim 1, wherein identifying the block of data comprises:
    identifying between 4 KB and 128 KB of data to include in the block.

3. The method of claim 1, wherein identifying the block of data comprises:
    determining entropy of chunks of data stored in the cache;
    including, in the block of data, chunks of data with entropy falling below a second threshold value.

4. The method of claim 3, wherein a chunk includes 4 KB of data.

5. The method of claim 3, wherein a chunk includes 8 KB of data.

6. The method of claim 3, wherein comparing the entropy of the block of data with the first threshold value comprises:
    determining the entropy of the block by averaging the entropy of chunks of data in the block.

7. The method of claim 1, wherein identifying the block of data comprises:
    identifying chunks of data stored in the cache within a predetermined window of time.

8. The method of claim 1, wherein deduplicating the block of data comprises:
    deduplicating the block of data in increments of 512 B.

9. The method of claim 1, further comprising:
    determining entropy of the deduplicated block of data;
    comparing the entropy of the deduplicated block of data with a third threshold value;
    based on the comparison, either compressing the deduplicated block of data or writing the deduplicated block of data to storage without compression.

10. The method of claim 9, wherein determining the entropy of the deduplicated block of data comprises:
    averaging the entropy of remaining data in the deduplicated block of data.

11. A system for use in managing inline data compression and deduplication in storage systems, the system comprising a processor configured to:
    identify, based on entropy, a block of data from data stored in a cache of a storage system;
    compare entropy of the block of data with a first threshold value;
    based on the comparison, either deduplicate the block of data or compress the block of data without deduplication.

12. The system of claim 11, wherein the processor is further configured to:
    identify between 4 KB and 128 KB of data to include in the block.

13. The system of claim 11, wherein the processor is further configured to:
    determine entropy of chunks of data stored in the cache;
    include, in the block of data, chunks of data with entropy falling below a second threshold value.

14. The system of claim 13, wherein a chunk includes 4 KB of data.

15. The system of claim 13, wherein a chunk includes 8 KB of data.

16. The system of claim 11, wherein the processor is further configured to:
    determine the entropy of the block by averaging the entropy of chunks of data in the block.

17. The system of claim 11, wherein the processor is further configured to:
    identify chunks of data stored in the cache within a predetermined window of time.

18. The system of claim 11, wherein the processor is further configured to:
    deduplicate the block of data in increments of 512 B.

19. The system of claim 11, wherein the processor is further configured to:
    determine entropy of the deduplicated block of data;
    compare the entropy of the deduplicated block of data with a third threshold value;
    based on the comparison, either compress the deduplicated block of data or write the deduplicated block of data to storage without compression.

20. The system of claim 19, wherein the processor is further configured to:
    average the entropy of remaining data in the deduplicated block of data.

* * * * *